US010267489B2

(12) United States Patent
Omori et al.

(10) Patent No.: US 10,267,489 B2
(45) Date of Patent: Apr. 23, 2019

(54) LIGHT-EMITTING APPARATUS

(71) Applicants: CITIZEN ELECTRONICS CO., LTD., Fujiyoshida-shi, Yamanashi (JP); CITIZEN WATCH CO., LTD., Tokyo (JP)

(72) Inventors: Yuji Omori, Yamanashi (JP); Makoto Yasuhara, Fujiyoshida (JP); Koki Hirasawa, Otsuki (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 83 days.

(21) Appl. No.: 15/386,778

(22) Filed: Dec. 21, 2016

(65) Prior Publication Data

US 2017/0175980 A1 Jun. 22, 2017

(30) Foreign Application Priority Data

Dec. 22, 2015 (JP) ................. 2015-249962
Oct. 27, 2016 (JP) ................. 2016-210844

(51) Int. Cl.
*F21V 5/04* (2006.01)
*F21V 9/30* (2018.01)
(Continued)

(52) U.S. Cl.
CPC ................ *F21V 9/30* (2018.02); *F21V 5/045* (2013.01); *F21V 7/22* (2013.01); *H01L 25/04* (2013.01);
(Continued)

(58) Field of Classification Search
CPC ... F21V 9/30; F21V 5/045; F21V 5/00; F21Y 2107/60; F21Y 2107/50; F21K 9/232
See application file for complete search history.

(56) References Cited

U.S. PATENT DOCUMENTS 3,735,124 A * 5/1973 Stahlhut .................... F21V 5/00
362/333
2007/0246714 A1* 10/2007 Koike ................. H01L 25/0753
257/79

(Continued)

FOREIGN PATENT DOCUMENTS

GB 2295274 5/1996
JP 0927641 1/1997
JP 2007294962 11/2007

*Primary Examiner* — Jong-Suk (James) Lee
*Assistant Examiner* — Christopher E Dunay
(74) *Attorney, Agent, or Firm* — RatnerPrestia

(57) ABSTRACT

Provided is a light-emitting apparatus including a substrate, an LED light source disposed on the substrate, and a reflecting frame disposed laterally of the LED light source on the substrate, wherein the LED light source includes a side-emitting LED device which is disposed on the substrate, and which emits light laterally toward the reflecting frame, and a top-emitting LED device which is disposed above the side-emitting LED device on the substrate so as to straddle the side-emitting LED device and so as to not block a portion of the light emitted from the side-emitting LED device, and which emits light upward, the light being different in color than the light emitted from the side-emitting LED device, and wherein the reflecting frame is disposed so that the light emitted from the side-emitting LED device is reflected upward.

9 Claims, 14 Drawing Sheets

(51) Int. Cl.
*F21V 7/22* (2018.01)
*H01L 25/04* (2014.01)
*F21Y 115/10* (2016.01)
*F21Y 113/17* (2016.01)

(52) U.S. Cl.
CPC ........ *F21Y 2113/17* (2016.08); *F21Y 2115/10* (2016.08); *G03B 2215/0567* (2013.01); *G03B 2215/0582* (2013.01); *G03B 2215/0592* (2013.01)

(56) References Cited

U.S. PATENT DOCUMENTS

| | | | |
|---|---|---|---|
| 2009/0097271 A1* | 4/2009 | Chen | G02F 1/133603 362/612 |
| 2009/0261237 A1* | 10/2009 | Backes | B60S 1/0837 250/227.11 |
| 2009/0262516 A1* | 10/2009 | Li | H01L 33/56 362/84 |
| 2009/0322197 A1* | 12/2009 | Helbing | H01L 33/507 313/46 |
| 2010/0061105 A1* | 3/2010 | Shyu | F21V 5/045 362/311.02 |
| 2011/0215696 A1* | 9/2011 | Tong | F21K 9/00 313/46 |
| 2012/0081897 A1* | 4/2012 | Ogawa | F21V 5/00 362/245 |
| 2015/0316215 A1* | 11/2015 | Togawa | H01L 25/0753 362/231 |
| 2016/0252217 A1* | 9/2016 | Achterhuis | F21S 9/037 362/183 |

\* cited by examiner (A)

(B)

LIGHT-EMITTING APPARATUS

CROSS REFERENCE TO RELATED APPLICATION

This application is a new U.S. patent application that claims benefit of JP2015-249962 filed on Dec. 22, 2015 and JP2016-210844 filed on Oct. 27, 2016. The entire contents of JP2015-249962 and JP2016-210844 are hereby incorporated by reference.

TECHNICAL FIELD

The present invention relates to a light-emitting apparatus using an LED device, and more particularly to a light-emitting apparatus using a plurality of LED devices that emit light of different colors.

BACKGROUND

In recent years, LED devices as semiconductor devices have come into wide use in lighting and other applications because of their long life and excellent driving characteristics and because of their small size, good luminous efficacy, and crisp and bright color emission.

Furthermore, portable terminals recently have come to be equipped with light-emitting apparatus that use an LED device as a camera flash light source. It is desirable that such a camera flash light-emitting apparatus, in combination with the spectral sensitivity of the camera's imaging device, have spectral characteristics such that a white object appears white when its image is captured by the camera. In view of this, a camera flash light-emitting apparatus is designed to be able to obtain the desired spectral characteristics by combining a plurality of LED light sources differing in color hues, for example, a white LED light source and an amber LED light source.

For example, Japanese Unexamined Patent Publication No. 2007-294962 discloses an LED package comprising a package body having a mounting portion for mounting LED chips thereon, and a plurality of LED chips mounted on the mounting portion, wherein the package body includes a reflective cup formed in an upper portion thereof, the mounting portion is disposed on a bottom portion of the reflective cup, an upper surface of the mounting portion is non-planar, and the mounting portion has an upwardly swelling cross-sectional shape, and wherein, between at least two adjacent LED chips, side faces of the chips face in different directions.

Japanese Unexamined Patent Publication No. H09-27641 discloses a light-emitting diode assembly comprising a substrate of a planar material, first and second conductors disposed on the substrate, a bare light-emitting diode positioned on a surface of the substrate and bonded to the conductors, a reflective face provided on the surface of the substrate on which the diode has been positioned, and a total internal reflection (TIR) lens, positioned over the diode, for gathering light emanating from the light-emitting diode in such a manner as to intensify the light emitted from the diode and the light reflected by the face.

SUMMARY

For example, in a light-emitting apparatus using two LED devices differing in color hues, whether the LED devices are mounted on a planar mounting surface or on a mounting portion whose cross sectional shape is trapezoidal, light rays emitted from the two LED devices are reflected by the reflective faces located on the opposite sides of the reflective frame (reflective cup) disposed so as to surround the LED devices, and are emitted directly to the outside (front side). As a result, the colors of the light rays from the two LED devices are not sufficiently mixed together, and the hue of the color of the light emitted from one or the other of the LED devices tends to be intensified on either side of the surface illuminated with the light. In other words, there has been the problem that the emitted color hues of the two different LED devices show up unchanged.

Further, in such a light-emitting apparatus, when light is not being emitted, the LED devices are visible through the lens disposed over the LED devices, but since the two LED devices are respectively coated with phosphors of different colors, two portions differing in color become visible within the light-emitting apparatus, presenting a problem in appearance.

It is an object of the present invention to solve the above problems and provide a light-emitting apparatus that can produce light of desired color by color mixing when emitting light and that appears uniform in color when not emitting light.

Provided is a light-emitting apparatus including a substrate, an LED light source disposed on the substrate, and a reflecting frame disposed laterally of the LED light source on the substrate, wherein the LED light source includes a side-emitting LED device which is disposed on the substrate, and which emits light laterally toward the reflecting frame, and a top-emitting LED device which is disposed above the side-emitting LED device on the substrate so as to straddle the side-emitting LED device and so as to not block a portion of the light emitted from the side-emitting LED device, and which emits light upward, the light being different in color than the light emitted from the side-emitting LED device, and wherein the reflecting frame is disposed so that the light emitted from the side-emitting LED device is reflected upward.

Preferably, the light-emitting apparatus further includes a lens disposed above the LED light source and the reflecting frame, wherein the top-emitting LED device emits the light toward the lens, and the reflecting frame reflects the light emitted from the side-emitting LED device toward the lens.

Preferably, the side-emitting LED device includes a reflective layer disposed on an upper surface of a sealing resin of an LED part.

Preferably, the top-emitting LED device includes legs located on both sides of the side-emitting LED device on the substrate, a light-emitting part supported on the legs, and a sealing resin sealing the light-emitting part.

Preferably, the top-emitting LED device has two legs, and the light emitted laterally from the side-emitting LED device in two directions 180 degrees apart is reflected by the reflecting frame.

Preferably, the top-emitting LED device has four legs, and the light emitted laterally from the side-emitting LED device in four directions 90 degrees apart is reflected by the reflecting frame.

Preferably, the lens includes, on a side thereof nearer to the side-emitting LED device and the top-emitting LED device, a groove pattern which is made up of a first plurality of sloping faces at which light rays emitted obliquely upward from the top-emitting LED device and incident on the lens are refracted, and a second plurality of sloping faces at which the light rays refracted at the first plurality of sloping faces are totally reflected, and at which light rays emitted from the side-emitting LED device and incident on the lens by being reflected by the reflecting frame are refracted.

Preferably, the lens further includes, on a side thereof opposite from the side-emitting LED device and the top-emitting LED device, a second groove pattern which is made up of a plurality of horizontal planar faces at which light rays incident from the side-emitting LED device and the top-emitting LED device are refracted so that the light rays emerge obliquely upward from the lens, and a third plurality of sloping faces at which the incident light rays are refracted so that the light rays emerge perpendicularly upward from the lens.

The above light-emitting apparatus can produce light of desired color by color mixing when emitting light, and appears uniform in color when not emitting light.

BRIEF DESCRIPTION OF THE DRAWINGS

Other features and advantages of the present invention will be apparent from the ensuing description, taken in conjunction with the accompanying drawings, in which.

DESCRIPTION

Figure 1:
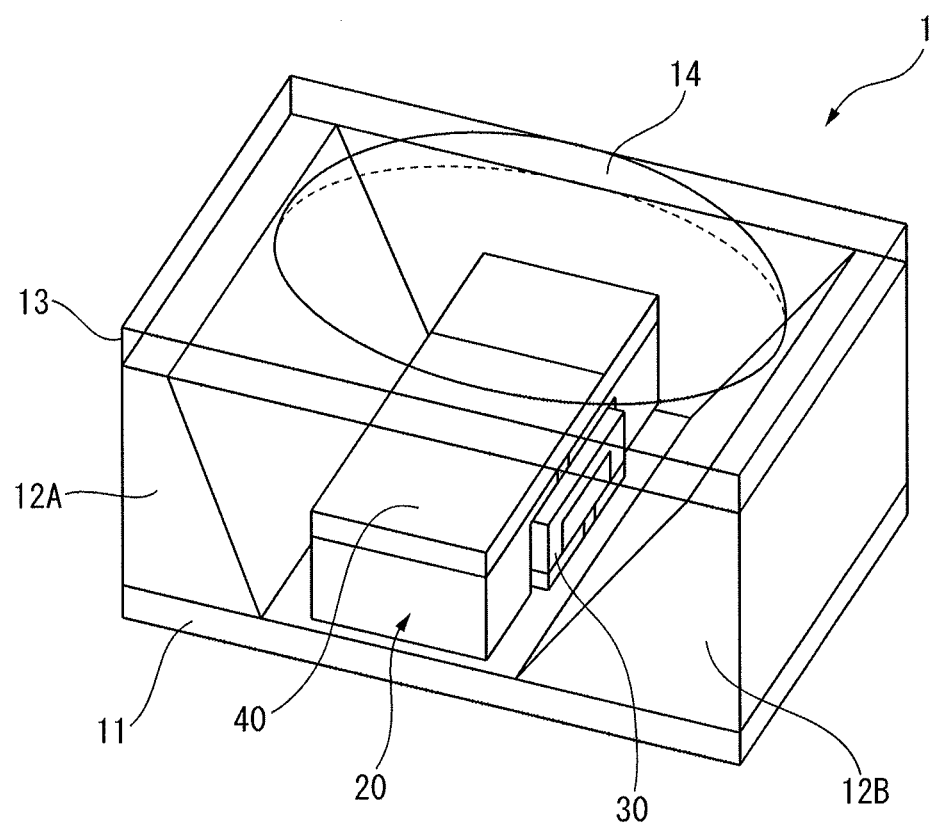
FIG. 1 is a perspective view of a light-emitting apparatus 1.

A light-emitting apparatus and a method for fabricating the same will be described below with reference to the drawings. It will, however, be noted that the present invention is not limited to the embodiments illustrated in the drawings or described herein. It will also be noted that, for ease of explanation of the present invention, the drawings are not necessarily drawn to scale.

Figure 2:
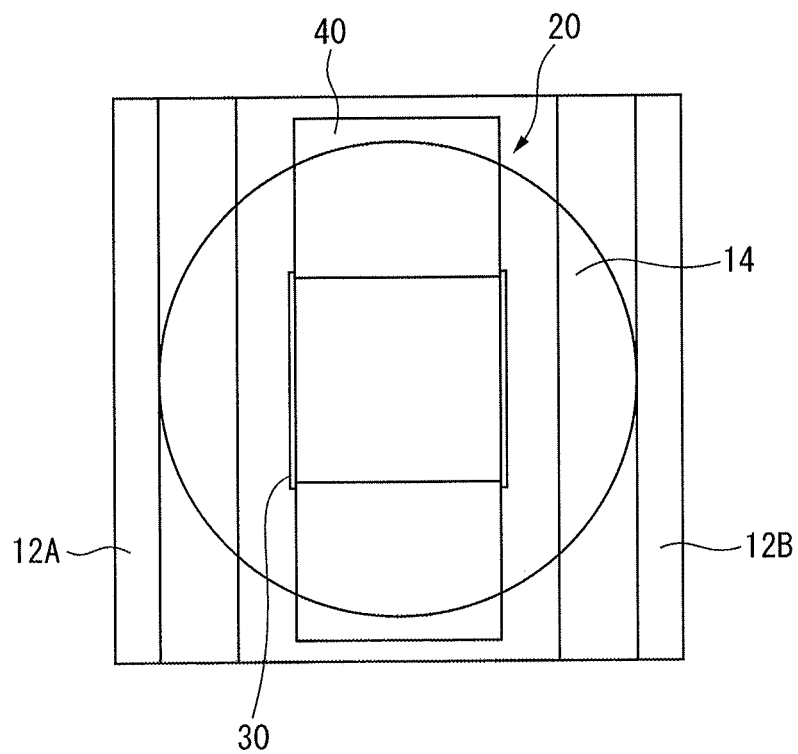
FIG. 2 is a projected view of the light-emitting apparatus 1.
Figure 2:
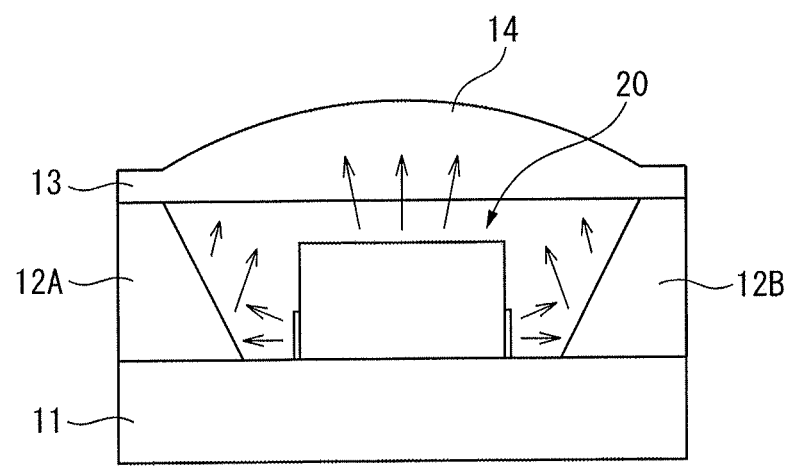

FIG. 1 is a perspective view of a light-emitting apparatus 1. FIG. 2 is a projected view of the light-emitting apparatus 1: part (A) is a top plan view, and part (B) is a side view.

The light-emitting apparatus 1 includes a substrate 11, reflecting members 12A and 12B, a lens member 13, and an LED light source unit 20. The light-emitting apparatus 1 is a light-emitting apparatus that can be used, for example, as a camera flash light source in a mobile telephone unit or as an LED light source for illumination, etc. In the following description, the side at which the lens member 13 is located with respect to the substrate 11 (the side opposite from the substrate 11 as seen from the LED light source unit 20) is referred to as the upper side, and the sides at which the reflecting members 12A and 12B are respectively located with respect to the LED light source unit 20 on the surface of the substrate 11 are referred to as the lateral sides.

The substrate 11 is an insulating substrate, for example, a ceramic substrate or a glass epoxy substrate, on the upper and lower surfaces of which electrodes and interconnection conductive patterns are formed. The reflecting members 12A and 12B, each trapezoidal in cross section, are disposed on the substrate 11 with their sloping faces opposing each other across the LED light source unit 20, and together constitute a reflecting frame. The opposing sloping faces of the reflecting members 12A and 12B are high-reflectivity faces at which the light emitted laterally from the LED light source unit 20 is reflected toward the upper side. The reflecting members 12A and 12B are formed from a high-reflectivity material such as aluminum, or alternatively, they are formed from a resin and the sloping faces are reflectorized, for example, by evaporating a metal such as silver.

The lens member 13 is formed from a transparent material, and its upper face or lower face or each face is formed as a spherical lens face 14 so that the lens member 13 functions as a lens. Instead of a spherical lens, a Fresnel lens may be used. The LED light source unit 20 includes a side-emitting LED device 30 and a top-emitting LED device 40.

Figure 3:
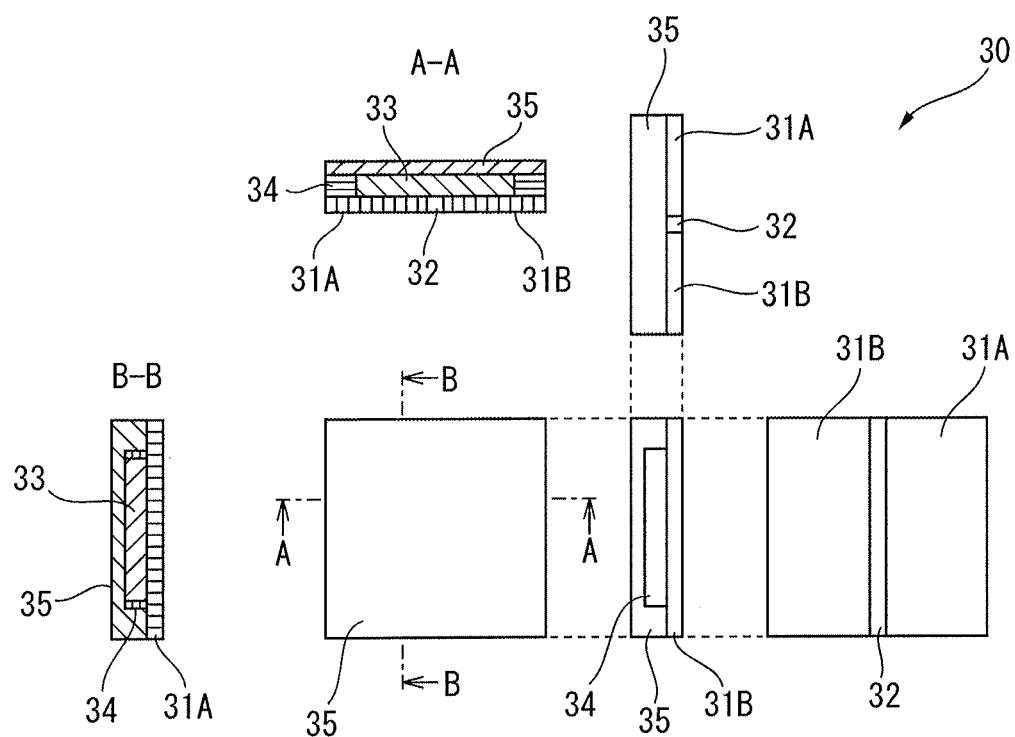
FIG. 3 is a projected view of the side-emitting LED device 30.

FIG. 3 is a projected view of the side-emitting LED device 30; a top view, a back view, two side views, and two cross-sectional views are shown here. The side-emitting LED device 30 includes electrodes 31A and 31B, an insulating member 32, an LED 33, a resin frame 34, and a white resin layer 35.

The electrodes 31A and 31B are electrodes for electrically connecting the side-emitting LED device 30 to the substrate 11. The insulating member 32 is a linearly extending member sandwiched between the electrodes 31A and 31B, and insulates the electrodes 31A and 31B from each other.

The LED 33 is mounted on the electrodes 31A and 31B so as to straddle the insulating member 32. The resin frame 34 is a rectangular frame member formed on the upper surfaces of the electrodes 31A and 31B and the insulating member 32 so as to surround the LED 33, and contains a phosphor for converting the wavelength of the light emitted from the LED 33. The resin frame 34 is exposed in two opposite side faces of the side-emitting LED device 30, and the other side faces of the resin frame 34 as well as its upper surface are covered with the white resin layer 35. The white resin layer 35 is formed so as to cover the top face of the side-emitting LED device 30 and the two side faces in which the resin frame 34 is not exposed.

In the side-emitting LED device 30, most of the light generated by the LED 33 is reflected by the white resin layer 35 into the phosphor-containing resin frame 34 where the light is converted by the phosphor into light of a desired color (wavelength), and the light is emitted from the two side faces in which the resin frame 34 is exposed. In this way, the side-emitting LED device 30 emits most of the light in two opposite lateral directions. The emission wavelength of the LED 33 and the phosphor to be contained in the resin frame 34 are, for example, chosen so that the side-emitting LED device 30 outputs (emits) light of amber color.

Figure 4:
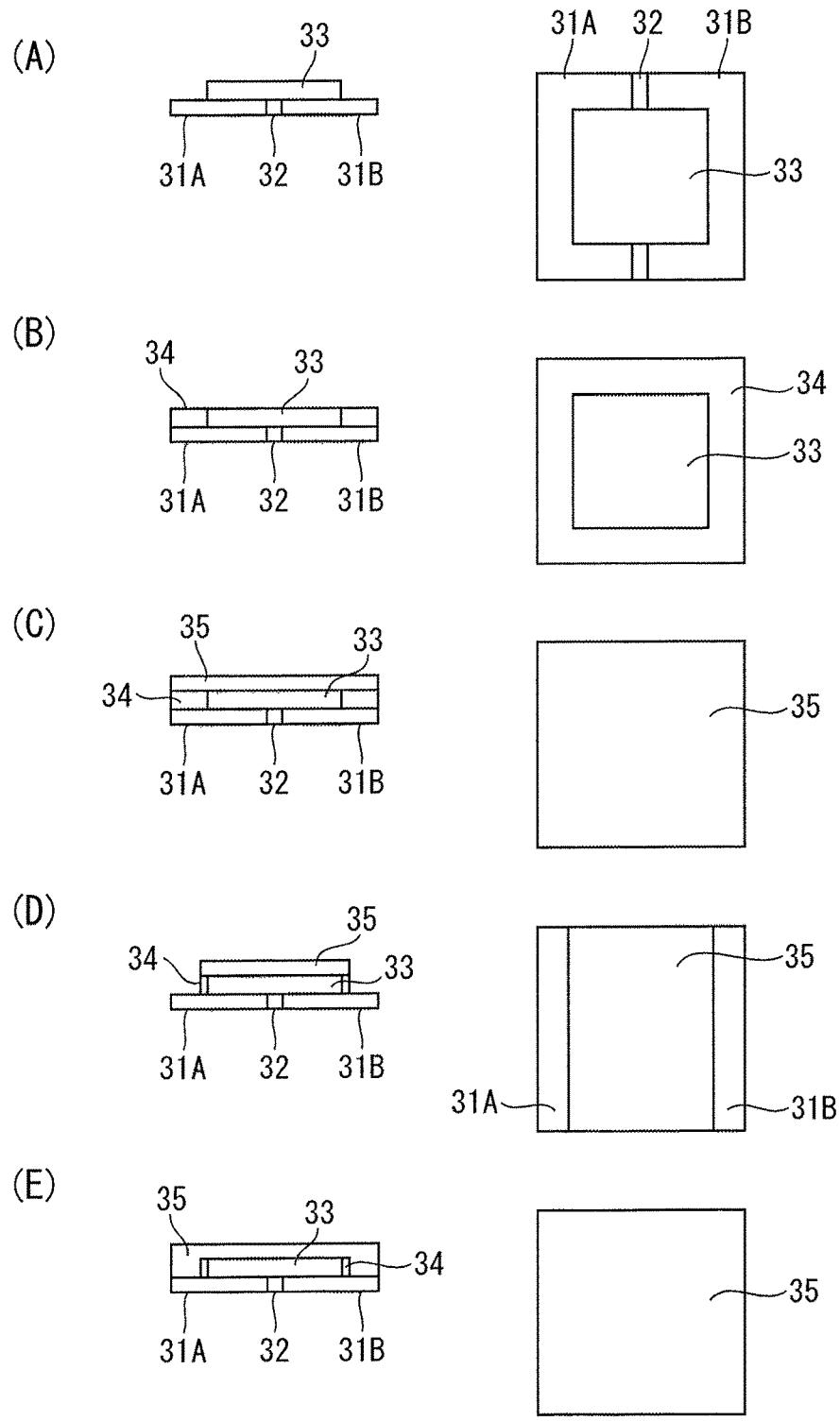
FIG. 4 is a diagram showing a fabrication process of the side-emitting LED device 30.

FIG. 4 is a diagram showing a fabrication process of the side-emitting LED device 30, and shows a cross-sectional view and a top plan view for each fabrication step. The fabrication process of the side-emitting LED device 30 will be described below with reference to FIG. 4.

First, a mounting substrate on which the LED 33 is mounted is prepared, as shown in part (A) of FIG. 4. The mounting substrate is a flat plate having the two electrodes 31A and 31B to be electrically connected to the LED 33 mounted thereon and the insulating member 32 for insulating them. Next, as shown in part (B) of FIG. 4, a phosphor-containing resin is applied around the LED 33 mounted on the mounting substrate, and thus the resin frame 34 dimensioned to match the width of the mounting substrate is formed to surround the LED 33. Further, as shown in part (C) of FIG. 4, the white resin layer 35 is formed to cover the LED 33 and the resin frame 34.

Next, as shown in part (D) of FIG. 4, the portions of the resin frame 34 and the white resin layer 35 that lie along two opposite sides (one of two opposite side pairs) of the LED 33 are removed by half-cut dicing. At this time, some portions of the resin frame 34 may be left unremoved along the two sides for processing reasons. Further, as shown in part (E) of FIG. 4, the white resin layer 35 is additionally deposited in the removed portions of the resin frame 34. The additionally deposited white resin layer 35 is integrated with the previously formed white resin layer 35, thus forming the U-shaped white resin layer 35. This completes the fabrication of the side-emitting LED device 30 shown in FIG. 3.

Figure 5:
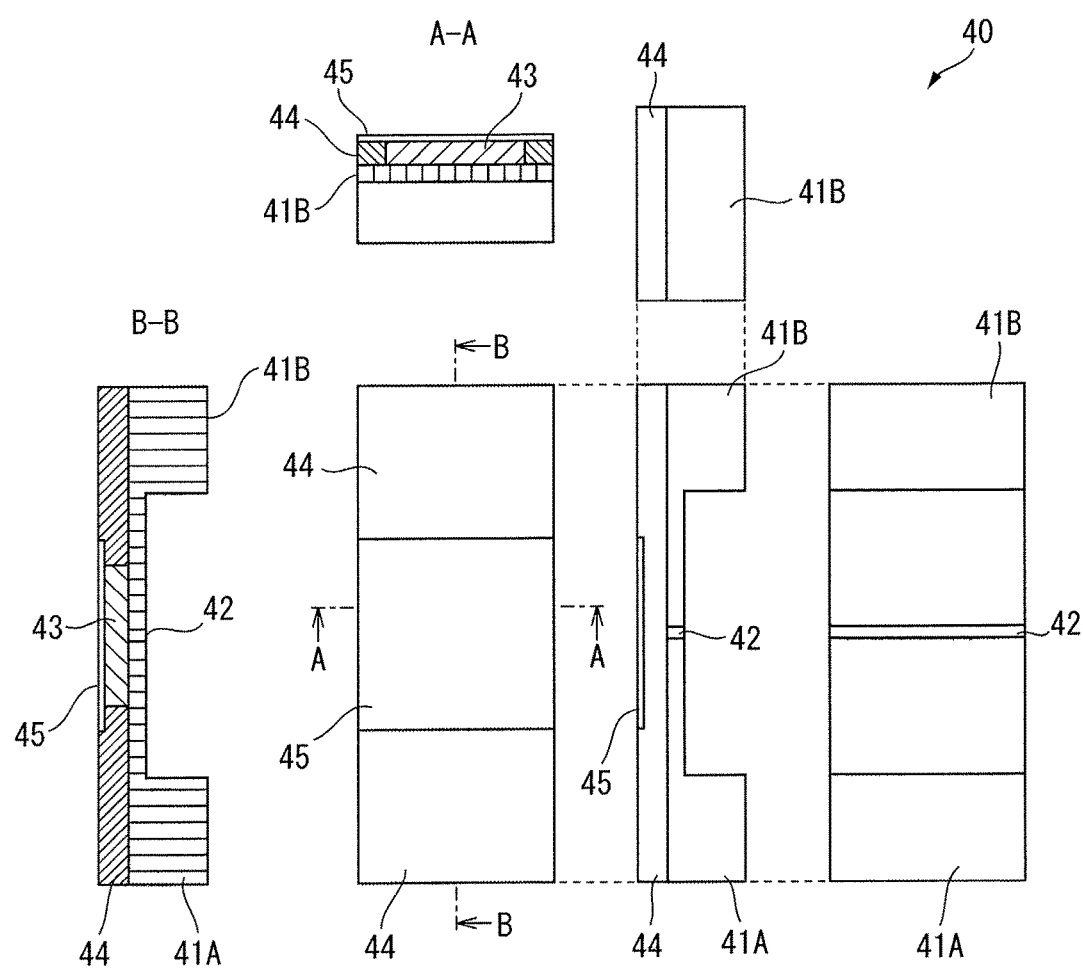
FIG. 5 is a projected view of the top-emitting LED device 40.

FIG. 5 is a projected view of the top-emitting LED device 40; a top view, a back view, two side views, and two cross-sectional views are shown here. The top-emitting LED device 40 includes electrodes 41A and 41B, an insulating member 42, an LED 43, a white resin layer 44, and a resin layer 45.

The electrodes 41A and 41B are electrodes for electrically connecting the top-emitting LED device 40 to the substrate 11. The insulating member 42 is a linearly extending member sandwiched between the electrodes 41A and 41B, and insulates the electrodes 41A and 41B from each other. The electrodes 41A and 41B correspond to two legs of the top-emitting LED device 40. The electrodes 41A and 41B and the insulating member 42 together correspond to the mounting substrate of the LED 43 and generally form a U-shaped leg portion with its two opposing sides open.

The LED 43 is mounted on the electrodes 41A and 41B so as to straddle the insulating member 42. The white resin layer 44 is formed over the upper surfaces of the electrodes 41A and 41B and the insulating member 42, except where the LED 43 is mounted, and entirely covers the four side faces of the LED 43. The resin layer 45 is a flat plate-like member covering the upper surface of the LED 43 and contains a phosphor for converting the wavelength of the light emitted from the LED 43. In the top-emitting LED device 40, the white resin layer 44 and the resin layer 45 are adjusted in thickness so that their upper surfaces are flush with each other.

In the top-emitting LED device 40, since the four side faces of the LED 43 are covered with the reflective white resin layer 44, most of the light generated by the LED 43 is passed through the phosphor-containing resin layer 45 where the light is converted by the phosphor into light of a desired color (wavelength), and the light is emitted from the upper surface of the resin layer 45. In this way, the top-emitting LED device 40 emits most of the light toward the upper side. The emission wavelength of the LED 43 and the phosphor to be contained in the resin layer 45 are, for example, chosen so that the top-emitting LED device 40 outputs (emits) white light.

In the fabrication of the top-emitting LED device 40, first the mounting substrate of the LED 43 is fabricated. The mounting substrate is fabricated, for example, by removing a center portion from the lower surface of a thick substrate containing the electrodes 41A and 41B and the insulating member 42 or by connecting a cuboidal member corresponding to the legs of the electrodes 41A and 41B to a thin substrate containing the electrodes 41A and 41B and the insulating member 42. Next, the LED 43 is placed on the above mounting substrate in such a manner that the LED 43 is electrically connected to the electrodes 41A and 41B, and the white resin layer 44 is formed to a thickness sufficient to fill the region around the LED 43 and to thinly cover the top face of the LED 43. Then, the white resin layer 44 is removed from the top face of the LED 43 by half-cut dicing, and the phosphor-containing resin layer 45 is formed on the removed portion. This completes the fabrication of the top-emitting LED device 40 shown in FIG. 5.

Figure 6:
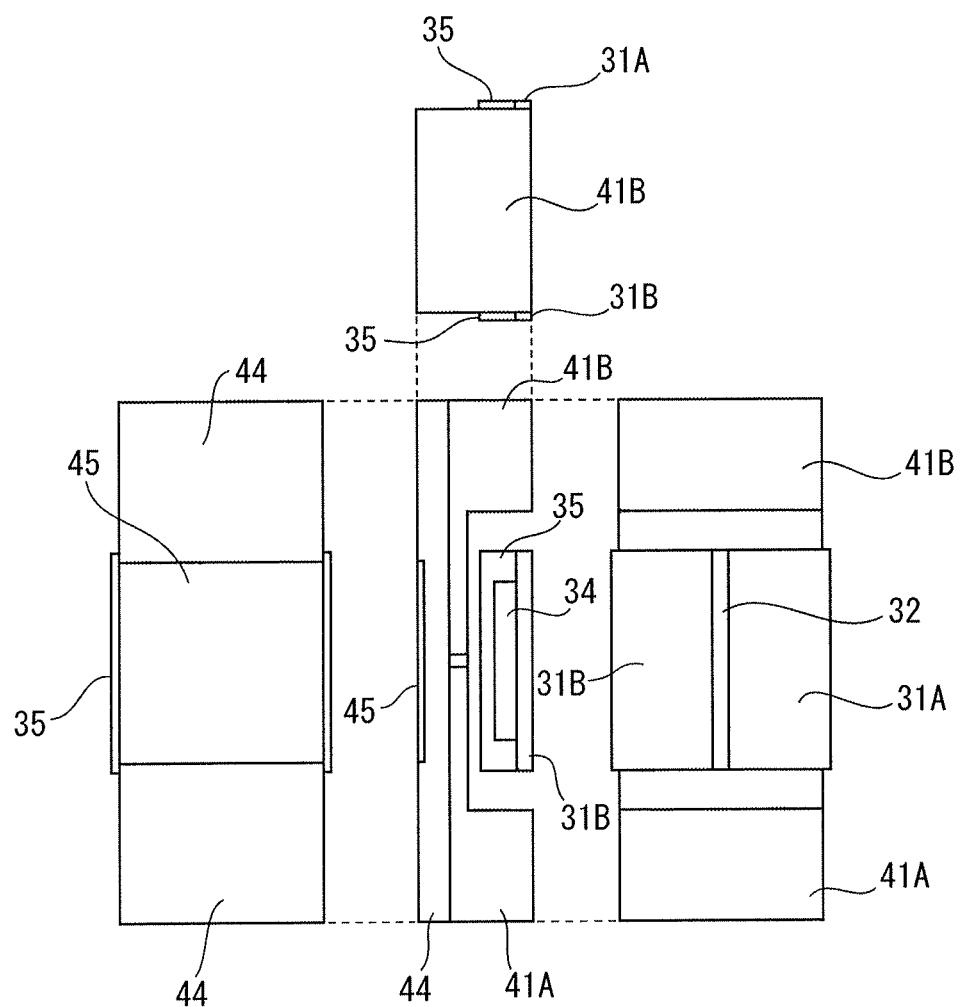
FIG. 6 is a projected view of the LED light source unit 20 including the side-emitting LED device 30 and the top-emitting LED device 40 disposed thereabove.

FIG. 6 is a projected view of the LED light source unit 20 including the side-emitting LED device 30 and the top-emitting LED device 40 disposed thereabove; a top view, a back view, and two side views are shown here. As shown in FIGS. 1, 2, and 6, the side-emitting LED device 30 is mounted so as to be accommodated in a U-shaped space created between the electrodes 41A and 41B of the top-emitting LED device 40. More specifically, the side-emitting LED device 30 is fixed in position with its electrodes 31A and 31B connected to the corresponding electrodes on the substrate 11. Next, the top-emitting LED device 40 is mounted so as to straddle the side-emitting LED device 30 and fixed in position with its electrodes 41A and 41B connected to the corresponding electrodes on the substrate 11. In other words, the top-emitting LED device 40 is disposed to straddle the side-emitting LED device 30.

As shown in part (B) of FIG. 2, the light emitted upward from the top-emitting LED device 40 is directed straight to the lens member 13, while the light emitted laterally from the side-emitting LED device 30 is reflected by the sloping faces of the reflecting members 12A and 12B toward the lens member 13. Since the light emitted laterally in two directions from the side-emitting LED device 30 is reflected by the opposing faces of the reflecting frame and emerges from the lens face 14, the emerging light has a left-right symmetrical distribution. The light from the top-emitting LED device 40 is also uniformly emitted toward the upper side. Since the light emitted from the side-emitting LED device 30 and the light emitted from the top-emitting LED device 40 are both uniformly distributed, a uniform light distribution, that is, good color mixing, can be achieved at the illuminating surface.

Further, when the LED light source unit 20 is viewed through the lens face 14 when the light is not being emitted, the phosphor-containing resin layer 45 of the top-emitting LED device 40 is visible in the center and, in close proximity to both sides therof, the exposed portions of the phosphor-containing resin frame 34 on the two side faces of the side-emitting LED device are visible. When the light is not being emitted, the resin layer 45 and the resin frame 34 appear different in color because the kinds of the phosphors are different, but appear substantially uniform because they are seen close to each other and because a different color portion (the resin layer 45) is visible between the two same color portions (the exposed portions of the resin frame 34). This improves the external appearance of the light-emitting apparatus.

In the LED light source unit 20, the side-emitting LED device 30 is configured to emit light in two opposite lateral directions, but may be configured to emit light in more than two directions. In a LED light source unit 21 described hereinafter, the side-emitting LED device 30 is configured to emit light in four directions 90 degrees apart in angle.

Figure 7:
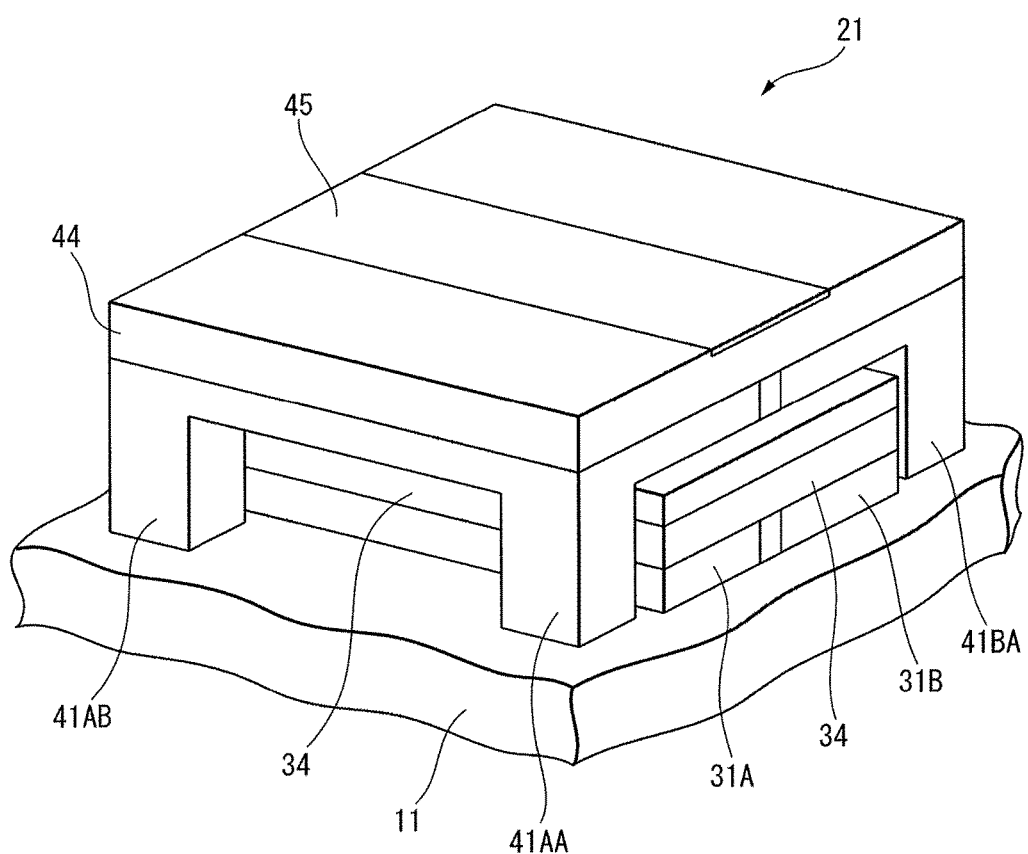
FIG. 7 is a perspective view of the LED light source unit 21.

FIG. 7 is a perspective view of the LED light source unit 21. In FIG. 7, the same portions as those in the LED light source unit 20 are designated by the same reference numerals. The LED light source unit 21 differs from the LED light source unit 20 in the shape of the legs of the top-emitting LED device 40 and the light emitting directions of the side-emitting LED device 30, but otherwise, the structure is the same as that of the LED light source unit 20.

The top-emitting LED device 40 has legs 41AA, 41AB, and 41BA shown in FIG. 7 and another one leg not shown. That is, the leg portion of the top-emitting LED device 40 is not U-shaped but four-legged. Accordingly, of the light emitted in all lateral directions from the side-emitting LED device 30, the light emitted in four directions 90 degrees apart is allowed to pass between the respective legs of the top-emitting LED device 40. The fabrication method of the top-emitting LED device 40 is the same as that described for the LED light source unit 20, except that the shape of the legs of the top-emitting LED device 40 is changed.

The side-emitting LED device 30 emits light not only in two lateral directions but also in all other directions. To fabricate this side-emitting LED device 30, the fabrication steps of parts (D) and (E) of FIG. 4, for example, should be omitted, and the resin frame 34 formed around the LED 33 should be left unremoved.

In the light-emitting device using the LED light source unit 21, four reflecting members similar to the reflecting members 12A and 12B are, for example, provided in four directions 90 degrees apart. In this case, the reflecting members may be formed as integral portions of a truncated square pyramid member, and its sloping faces may be treated to provide reflective faces. Alternatively, the reflecting members may be formed as portions of a truncated cone.

In the light-emitting device using the LED light source unit 21, the light emitted upward from the top-emitting LED device 40 is directed toward the lens member 13, as in the light-emitting apparatus 1, while the light emitted in four lateral directions from the side-emitting LED device 30 is reflected by the reflective faces of the respective reflecting members and directed toward the lens member 13. As a result, the distribution of the emerging light becomes more uniform, and the light distribution at the illuminating surface, that is, color mixing, is further improved. As in the light-emitting apparatus 1, the external appearance of the light-emitting apparatus is also improved.

Figure 8:
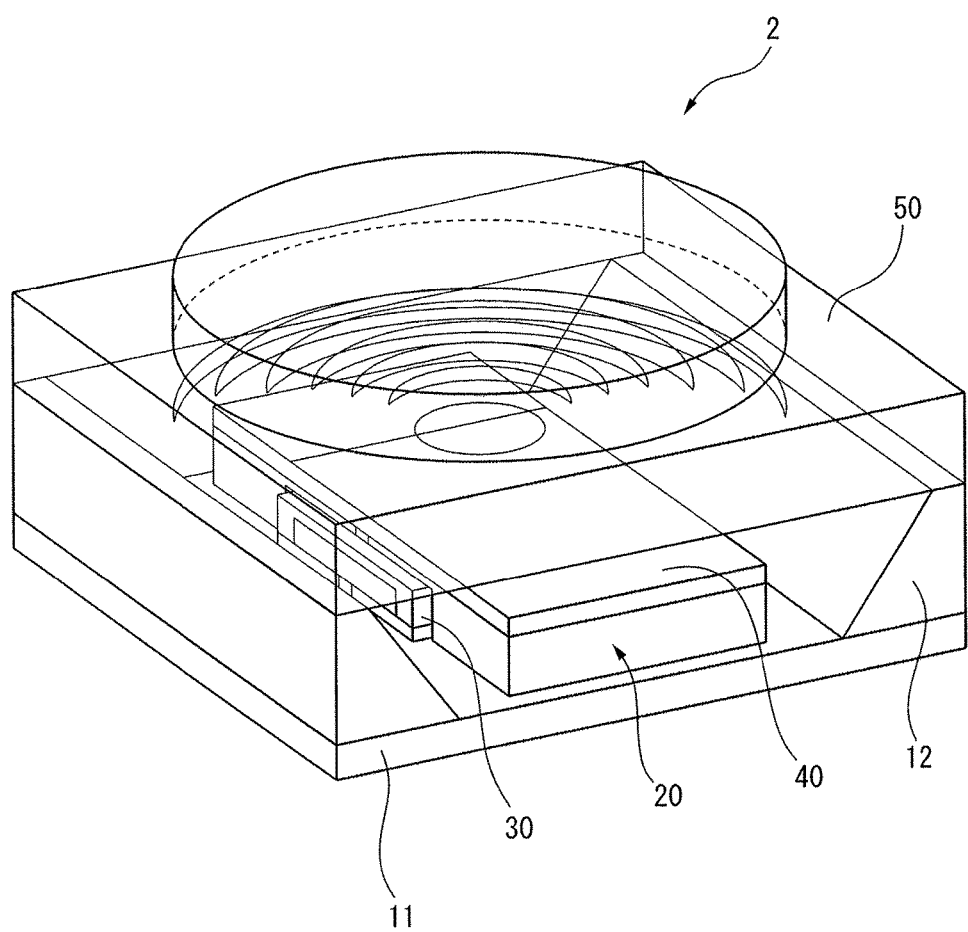
FIG. 8 is a perspective view of a light-emitting apparatus 2.
Figure 9:
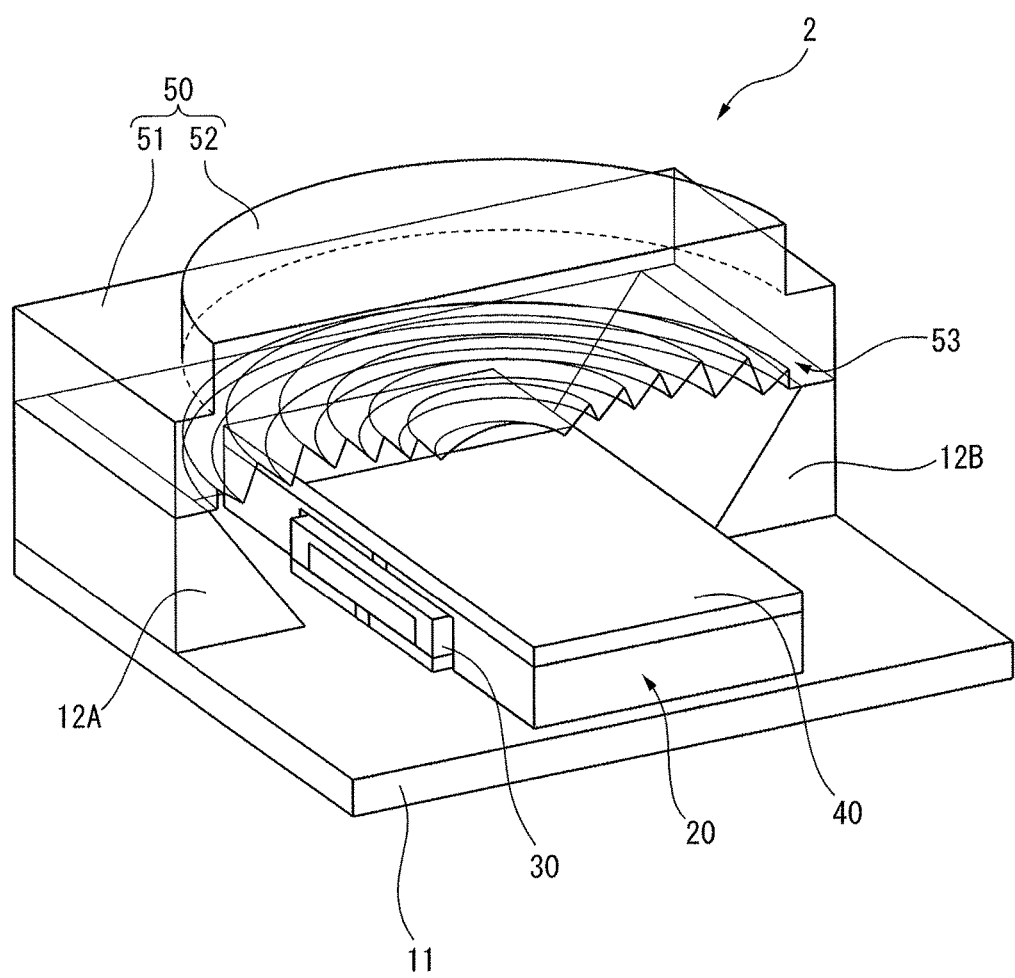
FIG. 9 is a broken-away perspective view of the light-emitting apparatus 2.

FIG. 8 is a perspective view of a light-emitting apparatus 2. FIG. 9 is a broken-away perspective view of the light-emitting apparatus 2. The light-emitting apparatus 2 includes a substrate 11, a reflecting member 12, an LED light source unit 20, and a lens member 50. Of these, the substrate 11 and the LED light source unit 20 are the same as those in the light-emitting apparatus 1. The LED light source unit 20 in the light-emitting apparatus 2 is also constructed from two kinds of LED devices, i.e., the side-emitting LED device 30 and the top-emitting LED device 40 described above. In the light-emitting apparatus 2, the reflecting member (reflecting frame) 12 having reflective faces similar to those of the reflecting members 12A and 12B described above is disposed so as to surround the entire structure of the LED light source unit 20, and the lens member 50 is disposed on the reflecting member 12 and above the LED light source unit 20.

The lens member 50 includes a flat plate-like base section 51 having the same length and width dimensions as the substrate 11, and a circular section 52 having a lateral dimension smaller than the base section 51 and positioned with its center aligned with the center of the base section 51. The circular section 52 is formed integrally with the base section 51. Further, the lens member 50 is a Fresnel lens having a concentric groove pattern 53 on the bottom face side of the base section 51 on which the light from the LED light source unit 20 is incident (that is, the side nearer to the side-emitting LED device 30 and the top-emitting LED device 40).

Figure 10:
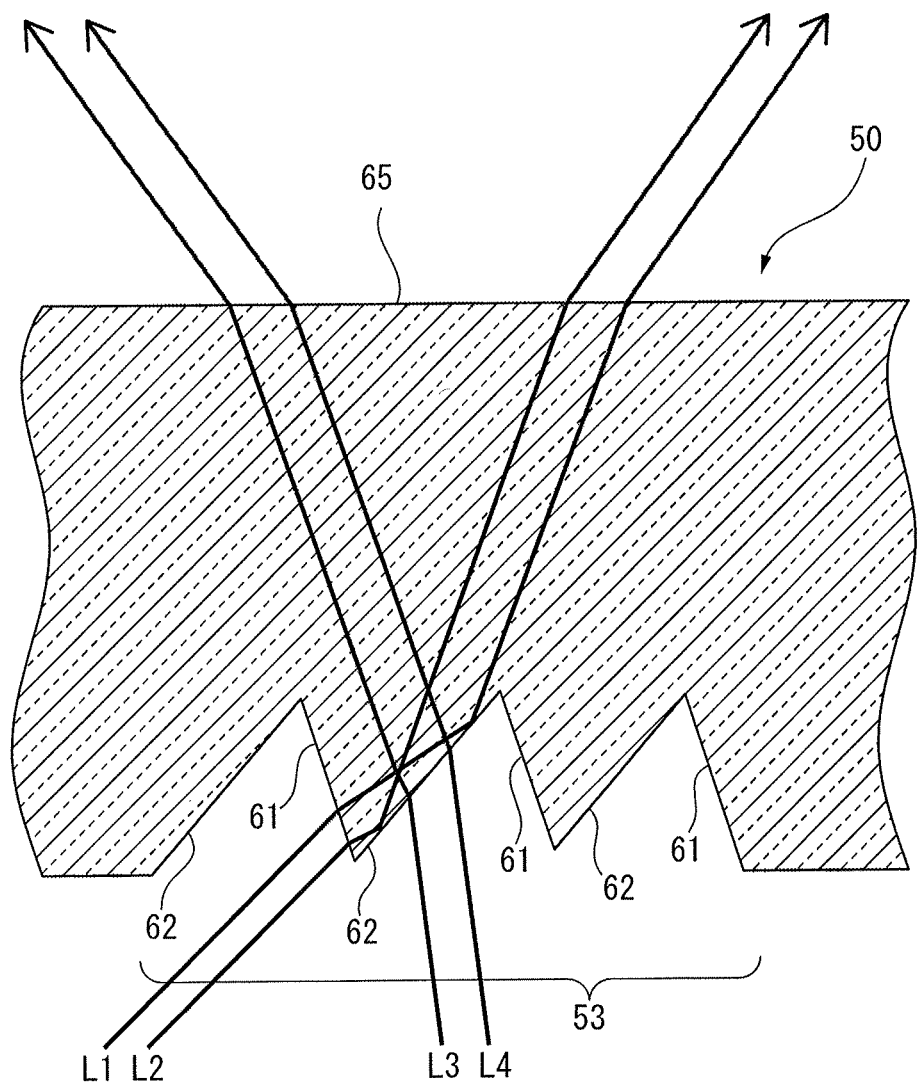
FIG. 10 is an enlarged cross-sectional view of a portion of the lens member 50.

FIG. 10 is an enlarged cross-sectional view of a portion of the lens member 50. The upper side of the lens member 50 shown in FIG. 10 corresponds to the top face of the circular section 52, and the lower side corresponds to the bottom face of the base section 51. Further, in FIG. 10, the left side is nearer to the center of the light-emitting apparatus 2 (the portion directly above the top-emitting LED device 40), and the right side is nearer to the periphery of the light-emitting apparatus 2 (the portion directly above the reflecting member 12).

The groove pattern 53 of the lens member 50 includes a plurality of sloping faces 61 and 62 formed in alternating fashion. On the other hand, the top face of the lens member 50 is formed as a horizontal planar surface 65. The sloping faces 61 are one example of a first plurality of sloping faces, each of which is formed to slant from the side nearer to the center of the light-emitting apparatus 2 toward the side nearer to the periphery thereof with decreasing distance to the lower side of the lens member 50 so as to be able to receive the light emitted from the top-emitting LED device 40. The light emitted obliquely upward from the top-emitting LED device 40 and incident on the lens member 50 is refracted at the sloping faces 61. The sloping faces 62 are one example of a second plurality of sloping faces, each of which is formed to slant from the side nearer to the periphery of the light-emitting apparatus 2 toward the side nearer to the center thereof (that is, toward the opposite side from the sloping faces 61) with decreasing distance to the lower side of the lens member 50 so as to be able to receive the light emitted from the side-emitting LED device 30. The light refracted at the sloping faces 61 is totally reflected by the sloping faces 62, and at the same time, the light emitted from the side-emitting LED device 30 and incident on the lens member 50 by being reflected from the reflecting member 12 is refracted at the sloping faces 62.

For example, light rays L1 and L2 in FIG. 10, emitted from the top-emitting LED device 40, directly enter the lens member 50 through the sloping face 61 where the light rays are refracted, and the refracted light rays are totally reflected by the sloping face 62, propagate through the lens member 50, are again refracted at the upper horizontal planar surface 65, and emerge obliquely upward from the lens member 50. On the other hand, light rays L3 and L4 emitted from the side-emitting LED device 30 and reflected by the reflecting member 12 enter the lens member 50 through the sloping face 62 where the light rays are refracted; after propagating through the lens member 50, the refracted light rays are again refracted at the upper horizontal planar surface 65, and emerge obliquely upward from the lens member 50.

As described above, the incident face of the lens member 50 has the sloping faces 61 on which the light from the top-emitting LED device 40 is incident and the sloping faces 62 on which the light from the side-emitting LED device 30 is incident. In the light-emitting apparatus 2, by forming the incident face of the lens member 50 in the shape of a Fresnel lens, the lens member 50 is made to function not only as a refractive lens but also as a TIR lens so that the same lens member can be used for both the side-emitting LED device 30 and the top-emitting LED device 40.

Since the exit face of the lens member 50 is the horizontal planar surface 65, the light emerging from the lens member 50 spreads obliquely upward. In the case of a camera flash light source, for example, it is desired to brightly illuminate not only the directly forward area but also its peripheral areas. Since the light emitted through the lens member 50 spreads obliquely upward as well, the light-emitting apparatus 2 is also suitable for use as a camera flash LED light source.

Figure 11:
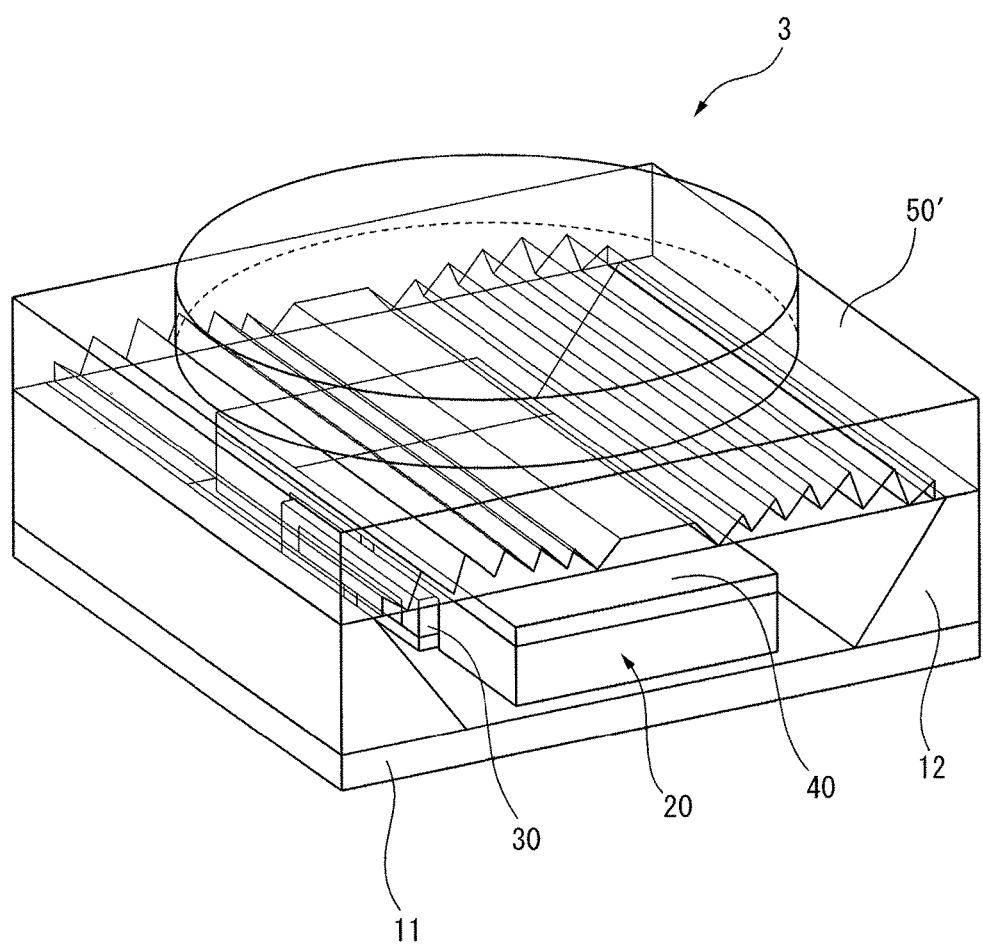
FIG. 11 is a perspective view of a light-emitting apparatus 3.
Figure 12:
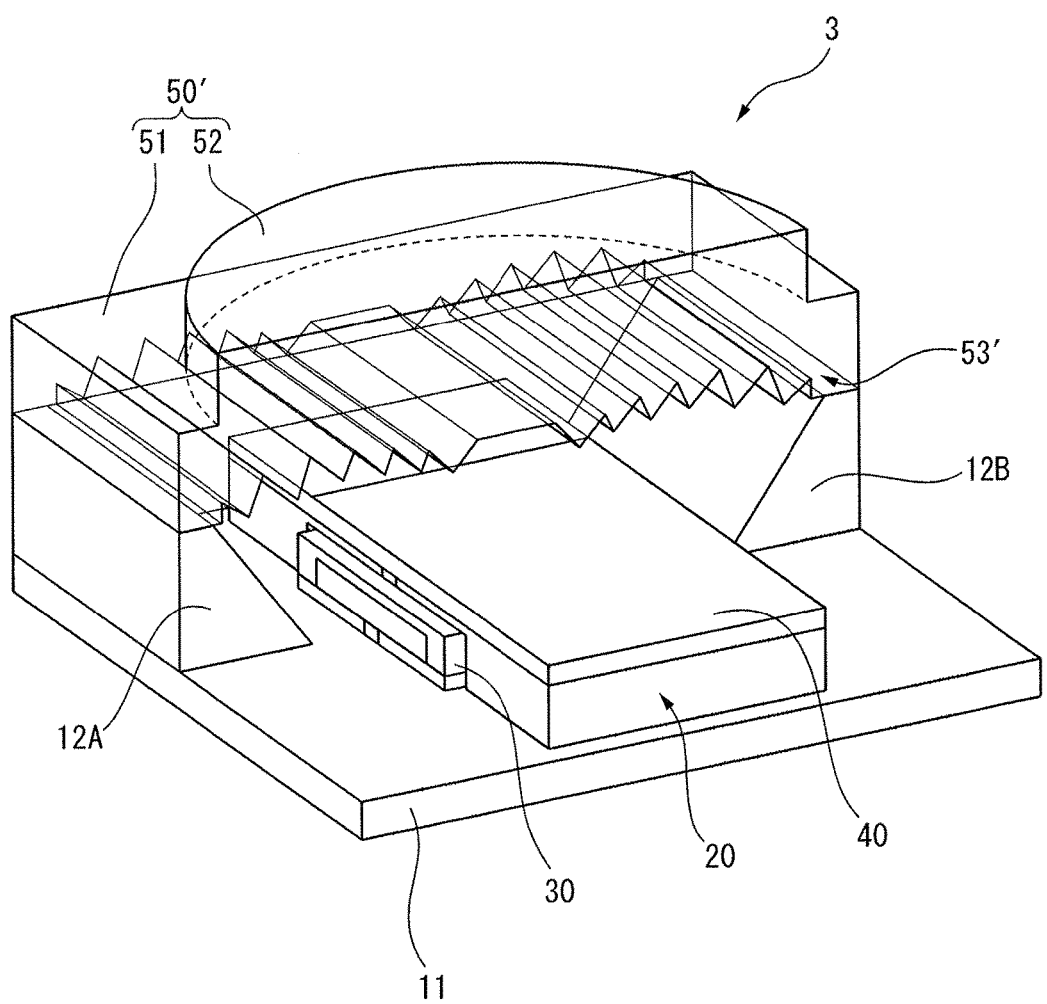
FIG. 12 is a broken-away perspective view of the light-emitting apparatus 3.

FIG. 11 is a perspective view of a light-emitting apparatus 3. FIG. 12 is a broken-away perspective view of the light-emitting apparatus 3. The light-emitting apparatus 3 is essentially identical in structure to the light-emitting apparatus 2, the only difference being the groove pattern of the lens member.

The lens member 50' of the light-emitting apparatus 3 has a groove pattern 53' on the bottom face side, as in the lens member 50 of the light-emitting apparatus 2, but the groove pattern 53' is formed from straight lines extending parallel to one side of the substrate 11, not from concentric circles. That is, the lens member 50' is a linear Fresnel lens with the straight groove pattern 53' formed on the bottom face side of the base section 51 on which the light from the LED light source unit 20 is incident. The cross section of the lens member 50' is essentially the same as that of the lens member 50 shown in FIG. 10, the only difference being whether the groove pattern is formed from concentric circles or from straight lines. The groove pattern 53' includes sloping faces similar to the sloping faces 61 and 62 shown in FIG. 10. The light ray paths from the LED light source unit 20 are also the same as those shown in FIG. 10. In this way, the groove pattern need not be limited to a concentric circle pattern, but may be formed as a straight line pattern, as in the lens member 50'.

Figure 13:
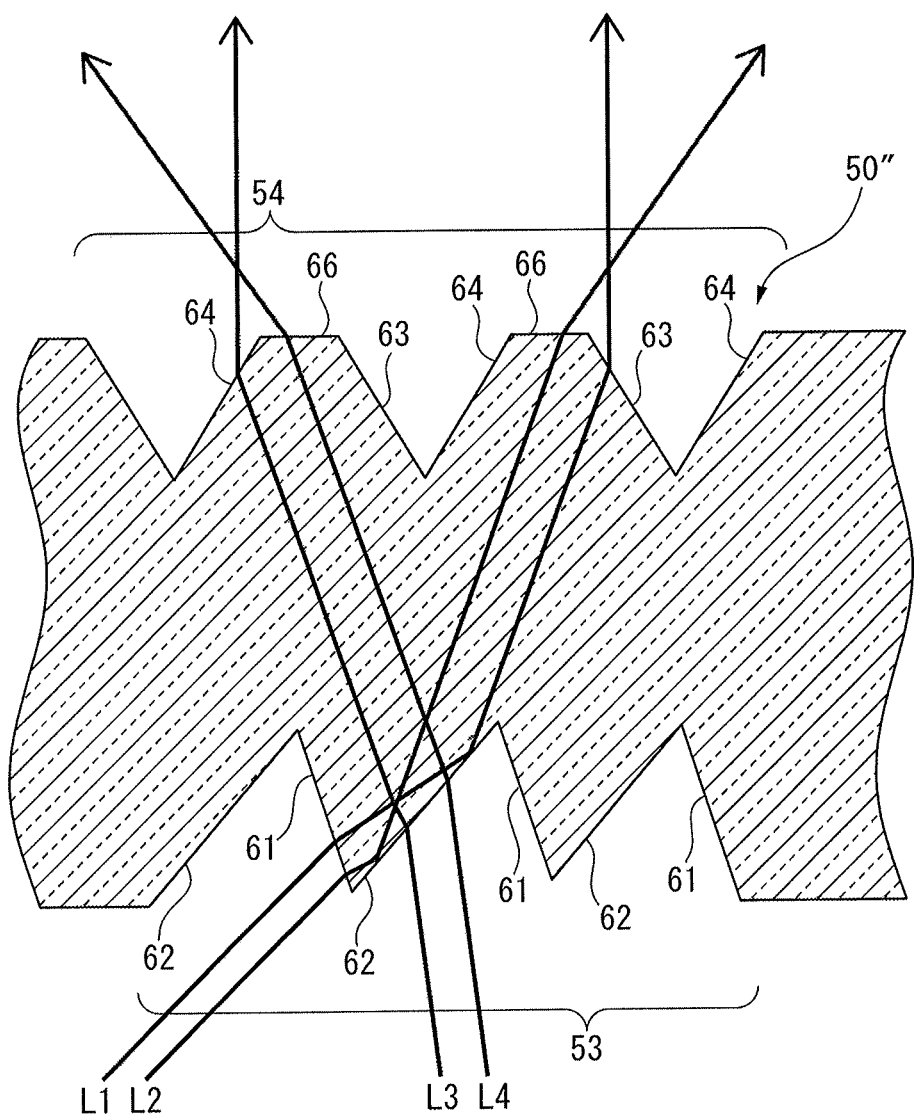
FIG. 13 is an enlarged cross-sectional view of a portion of a lens member 50"

FIG. 13 is an enlarged cross-sectional view of a portion of a lens member 50". The lens member 50" is a Fresnel lens having a concentric groove pattern 53 on the bottom face side nearer to the side-emitting LED device 30 and the top-emitting LED device 40 and a concentric groove pattern 54 on the top face side opposite from the side-emitting LED device 30 and the top-emitting LED device 40. Each of the previously described lens members 50 and 50' has the groove pattern only on the bottom face side, but the lens member of the light-emitting apparatus may be formed to have groove patterns on both the top face and bottom face sides, as in the lens member 50". In FIG. 13, as in FIG. 10, the left side is nearer to the center of the light-emitting apparatus (the portion directly above the top-emitting LED device 40), and the right side is nearer to the periphery of the light-emitting apparatus (the portion directly above the reflecting member 12).

The groove pattern 53 is the same as that of the lens member 50, and includes a plurality of sloping faces 61 and 62 formed in alternating fashion. On the other hand, the groove pattern 54 is one example of a second groove pattern and is formed from a repeating pattern of a sloping face 63, a sloping face 64, and a horizontal planar face 66. The sloping faces 63 are one example of a third plurality of sloping faces, each of which is formed to slant from the side nearer to the center of the light-emitting apparatus toward the side nearer to the periphery thereof with decreasing distance to the lower side of the lens member 50". The sloping faces 64 are one example of the third plurality of sloping faces, each of which is formed to slant from the side nearer to the periphery of the light-emitting apparatus toward the side nearer to the center thereof (that is, toward the opposite side from the sloping faces 63) with decreasing distance to the lower side of the lens member 50". The light rays incident from the side-emitting LED device 30 and the top-emitting LED device 40 and propagated through the lens member 50" are refracted at the sloping faces 63 and 64 and emerge perpendicularly upward from the lens member 50". On the other hand, the horizontal planar faces 66 function to refract the light rays incident on the lens member 50" and propagated therethrough and cause the light rays to emerge obliquely upward from the lens member 50".

For example, the light ray L1 in FIG. 13, emitted from the top-emitting LED device 40, directly enters the lens member 50" through the sloping face 61 where the light ray is refracted, and the refracted light ray is totally reflected by the sloping face 62, propagates through the lens member 50", is again refracted at the upper sloping face 63, and emerges perpendicularly upward from the lens member 50". The light ray L3 emitted from the side-emitting LED device 30 and reflected by the reflecting member 12 enters the lens member 50" through the sloping face 62 where the light ray is refracted; after propagating through the lens member 50", the refracted light ray is again refracted at the upper sloping face 64, and emerges obliquely upward from the lens member 50".

On the other hand, the light ray L2 in FIG. 13, emitted from the top-emitting LED device 40, also enters the lens member 50" through the sloping face 61 and is totally reflected by the sloping face 62, as in the case of the light ray L1, but after that, the light ray L2 is again refracted at the upper horizontal planar face 66 and emerges obliquely upward from the lens member 50". The light ray L4 emitted from the side-emitting LED device 30 and reflected by the reflecting member 12 also enters the lens member 50" through the sloping face 62, as in the case of the light ray L3, but after that, the light ray L4 is again refracted at the horizontal planar face 66 and emerges obliquely upward from the lens member 50".

Since the lens member 50" has the groove pattern 54 at the emergence plane, the emerging light rays can be split into those directed perpendicularly upward and those directed obliquely upward. Accordingly, the light-emitting apparatus using the lens member 50" can brightly illuminate not only the directly forward area but also its peripheral areas. Furthermore, by adjusting the shape of the groove pattern 54, the light can be emitted in any desired direction.

In FIG. 13, with the perpendicular direction taken as the reference of the angle (0 degree), angles slanted to the right in the figure are taken as positive, and angles slanted to the left in the figure are taken as negative. When the angles are defined in this manner, the sloping faces 61 to 64 of the lens member 50" shown in FIG. 13 have slope angles of, for example, −20 degrees, +45 degrees, −58 degrees, and +58 degrees, respectively. That is, between the sloping faces 61 and 62, the slope angle of the sloping faces 62 relative to the perpendicular direction is greater in absolute terms, and thus the slope is gentler. On the other hand, between the sloping faces 63 and 64, the magnitude of the slope is the same.

In the light-emitting apparatus using the lens member 50", the angles of the reflective faces of the reflecting member 12 are adjusted so that the light is emitted in the desired direction. For example, suppose that the light needs to be emitted from the lens member 50" in directions ±37.5 degrees as well as 0 degree. In this case, the light rays L1 and L2 emitted from the top-emitting LED device 40 should be made incident at 45 degrees on the sloping face 61, the light rays L3 and L4 emitted from the side-emitting LED device 30 and reflected from the reflecting member 12 should be made incident at −11 degrees on the sloping face 62, and the respective light rays should be made to propagate through the lens member 50" at ±23.7 degrees. Therefore, the angles of the reflective faces of the reflecting member 12 are adjusted so that the light rays L3 and L4 will be incident at −11 degrees on the lens member 50". That is, the incident angle of the refracted light is adjusted so that the TIR light incident from the top-emitting LED device 40 and the refracted light incident from the side-emitting LED device 30 will be propagated through the lens member 50" in directions slanted at the same angle relative to the perpendicular direction (the normal direction).

In the light-emitting apparatuses 2 and 3 as well as the light-emitting apparatus using the lens member 50", there is the same effect as that achieved in the light-emitting apparatus 1, that is, the distribution of the emitted light is uniform and the color mixing for light emission improves, and the light-emitting apparatus appears uniform in color when not emitting light. Furthermore, since the top-emitting LED device 40 is mounted so as to straddle the side-emitting LED device 30, there is also the effect that the size of the light-emitting region can be reduced compared with the case where the two devices are arranged side by side in the horizontal direction.

Figure 14:
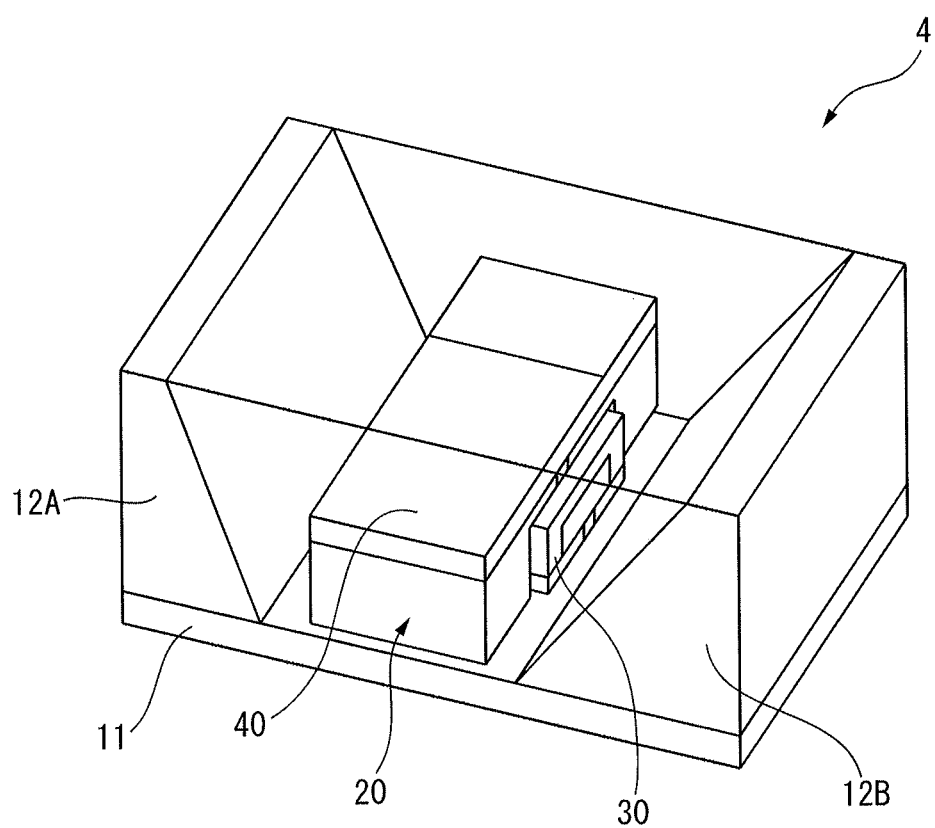
FIG. 14 is a perspective view of a light-emitting apparatus 4.

FIG. 14 is a perspective view of a light-emitting apparatus 4. The light-emitting apparatus 4 differs from any of the previously described light-emitting apparatus by the omission of the lens member, but otherwise, the structure is the same as that of the light-emitting apparatus 1. As in the light-emitting apparatus 4, the light-emitting apparatus need not necessarily be provided with the lens member. In the light-emitting apparatus 4, the light emitted from the top-emitting LED device 40 is directed upward as it is emitted, and emerges uniformly from the light-emitting apparatus. On the other hand, the light emitted from the side-emitting LED device 30 is reflected upward by the sloping faces of the reflecting members 12A and 12B, and emerges with the light distribution spreading symmetrically left and right. In the light-emitting apparatus 4, since the configuration of the LED light source unit 20 and the structure of the reflecting members 12A and 12B are the same as those in the light-emitting apparatus 1, a uniform light distribution, that is, good color mixing, can be achieved at the illuminating surface, as in the light-emitting apparatus 1. Further, as in the light-emitting apparatus 1, the external appearance of the light-emitting apparatus 4 is also improved.

While the embodiments of the present invention have been described above, it will be appreciated that various modifications are possible. For example, in the LED light source unit 21 shown in FIG. 7, the resin frame 34 may not be exposed around the entire periphery of the side-emitting LED device 30, but the white resin layer 35 may be formed at the four corners, and the resin frame 34 may be exposed only in four directions defined therebetween. Further, a groove pattern similar to the groove pattern 54 formed on the lens member 50" of FIG. 13 may be formed on the top face of the lens member 50' of FIG. 11. Furthermore, the light-emitting apparatus having the LED light source unit 21 may be provided with any one of the lens members 50, 50', and 50".

The preceding description is merely to illustrate and describe exemplary embodiments of the present invention. It is not intended to be exhaustive or limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, the invention is not limited to the particular embodiment disclosed as the best mode contemplated for carrying out this invention, but the invention includes all embodiments falling within the scope of the claims. The invention may be practiced otherwise than is specifically explained and illustrated without departing from its spirit or scope.

What is claimed is:

1. A light-emitting apparatus comprising:
   a substrate;
   a side-emitting LED device which is disposed on the substrate and includes side faces in which a resin frame containing a phosphor is exposed, wherein the side-emitting LED device emits light laterally from the side faces; and
   a top-emitting LED device which includes an upper surface in which a resin layer containing a phosphor is exposed and legs fixed on the substrate, wherein the top-emitting LED device emits light upward from the upper surface, the light being different in color than the light emitted from the side-emitting LED device; and
   a reflecting frame disposed on the substrate so as to surround the side-emitting LED device and reflect the light emitted from the side-emitting LED device upward,
   wherein the side-emitting LED device is accommodated in a space created by the legs between the substrate and the top-emitting LED device, and is aligned with the top-emitting LED device vertically relative to the substrate.

2. The light-emitting apparatus according to claim 1, further comprising a lens disposed above the top-emitting LED light source and the reflecting frame, wherein
   the top-emitting LED device emits the light toward the lens, and
   the reflecting frame reflects the light emitted from the side-emitting LED device toward the lens.

3. The light-emitting apparatus according to claim 2, wherein the side-emitting LED device includes a reflective layer disposed on an upper surface of a sealing resin of an LED part.

4. The light-emitting apparatus according to claim 2, wherein the top-emitting LED device includes:
   a light-emitting part supported on the legs; and
   a sealing resin sealing the light-emitting part.

5. The light-emitting apparatus according to claim 4, wherein the top-emitting LED device has two legs, and
   the light emitted laterally from the side-emitting LED device in two directions 180 degrees apart is reflected by the reflecting frame.

6. The light-emitting apparatus according to claim 4, wherein the top-emitting LED device has four legs, and
   the light emitted laterally from the side-emitting LED device in four directions 90 degrees apart is reflected by the reflecting frame.

7. The light-emitting apparatus according to claim 2, wherein the lens includes, on a side thereof nearer to the side-emitting LED device and the top-emitting LED device, a groove pattern which is made up of:
- a first plurality of sloping faces at which light rays emitted obliquely upward from the top-emitting LED device and incident on the lens are refracted; and
- a second plurality of sloping faces at which the light rays refracted at the first plurality of sloping faces are totally reflected, and at which light rays emitted from the side-emitting LED device and incident on the lens by being reflected by the reflecting frame are refracted.

8. The light-emitting apparatus according to claim 7, wherein the lens further includes, on a side thereof opposite from the side-emitting LED device and the top-emitting LED device, a second groove pattern which is made up of:
- a plurality of planar faces substantially parallel to the substrate at which light rays incident from the side-emitting LED device and the top-emitting LED device are refracted so that the light rays emerge obliquely upward from the lens; and
- a third plurality of sloping faces at which the incident light rays are refracted so that the light rays emerge perpendicularly upward from the lens relative to the planar faces.

9. The light-emitting apparatus according to claim 1, wherein side portions of the side-emitting LED device protrude laterally from the top-emitting LED device on two opposing sides of the resin layer, when the light-emitting apparatus is viewed from above.

* * * * *